United States Patent [19]
Barford et al.

[11] Patent Number: 5,946,482
[45] Date of Patent: Aug. 31, 1999

[54] METHOD AND APPARATUS FOR USING PARAMETERS TO SIMULATE AN ELECTRONIC CIRCUIT

[75] Inventors: Lee A. Barford, San Jose; Norman H. Chang, Fremont; Boris Troyanovsky, San Francisco, all of Calif.

[73] Assignee: Hewlett-Packard Company, Palo Alto, Calif.

[21] Appl. No.: 08/857,427

[22] Filed: May 16, 1997

[51] Int. Cl.$^6$ ..................................................... G06F 9/455
[52] U.S. Cl. ..................................................... 395/500.35
[58] Field of Search .......................... 364/578, 488–491; 324/754, 615; 330/149; 706/31; 395/500.34, 500.35, 500.36; 702/57, 66, 75, 76, 117–126

[56] References Cited

U.S. PATENT DOCUMENTS

| | | | |
|---|---|---|---|
| 5,025,402 | 6/1991 | Winkelstein | 364/578 |
| 5,163,015 | 11/1992 | Yokota | 364/578 |
| 5,231,349 | 7/1993 | Majidi-Ahy et al. | 324/754 |
| 5,291,140 | 3/1994 | Wagner | 324/615 |
| 5,379,231 | 1/1995 | Pillage et al. | 364/488 |
| 5,553,195 | 9/1996 | Meijer | 706/31 |
| 5,770,972 | 6/1998 | Freuler et al. | 330/149 |

OTHER PUBLICATIONS

J. Schoukens, et al., "Identification of Linear Systems: A Practical Guide to Accurate Modeling", Pergamon Press, 1991.

J. Alvin Connelly, et al., "Macromodeling with SPICE", Prentice Hall, Englewood Cliffs, New Jersey 07632, 1992.

L. Miguel Silveira, et al., "An Efficient Approach to Transmission Line Simulation Using Measured or Tabulated S–Parameter Data", 31st ACM/IEEE Design Automation Conference, 1994, pp. 634–639.

I Kollar, et al., "Frequency Domain System Identification Toolbox for Matlab: A Complex Application Example", IFAC System Identification, Copenhagen, Denmark, 1994, pp. 1619–1624.

Boris Troyanovsky, et. al., "Integration of Transient S–Parameter Simulation into HPSPICE", HPL–95–61, Jun. 1995, pp. 1–5.

Haifang Liao, et. al., "Scattering Parameter Transient Analysis of Interconnect Networks with Nonlinear Terminations Using Recursive Convolution", UCSC–CRL–93–28, Board of Studies in Computer Engineering UC Santa Cruz, pp. 1–16.

Shen Lin, et. al., "Transient Simulation of Lossy Interconnects Based on the Recursive Convolution Formulation", IEEE Transactions on Circuits and Systems–I: Fundamental Theory and Applications, vol. 39, No. 11, Nov. 1992, pp. 879–892.

Haifang Liao, et. al., "S–Parameter Based Macro Model of Distributed–Lumped Networks Using Pade Approximation", 1993 IEEE, pp. 2319–2322.

Norman Chang, et al., "Fast Time Domain Simulation in SPICE with Frequency Domain Data", Hewlett–Packard Laboratories, Palo Alto CA 94304.

Y. Rolain, et al., "Parametric Modelling of Linear Time Invariant S–Parameter Devices in the Laplace Demain", IEEE Instrumentation and Measurement Technology Conference, Brussels, Belgium, Jun. 4–6, 1996, pp. 1244–1249.

J. Eric Bracken, "Simulating Distributed Elements with Asymptotic Waveform Evaluation", 1992 IEEE MTT–S Digest, pp. 1337–1340.

Lee Barford, et al., "System Identification Techniques for Fast, Recursive Convolution Based Circuit Simulation for Large RC Circuits", HP Design Technology Conference, 1995, pp. 1–8.

Norman H. Chang, et. al., "IPDA: Interconnect Performance Design Assistant", Proceedings 29th ACM/IEEE Design Automation Conference, Jun. 8–12, 1992, Anaheim, California, pp. 472–477.

Keh–Jeng Chang, et. al., "Parameterized SPICE Subcircuits for Multilevel Interconnect Modeling and Simulation", IEEE Transactions on Circuits and Systems–II: Analog and Digital Signal Processing, vol., 39, No. 11, Nov. 1992, pp. 779–789.

*Primary Examiner*—Kevin Teska
*Assistant Examiner*—Dan Fiul
*Attorney, Agent, or Firm*—Marc P. Schuyler

[57] ABSTRACT

The present disclosure provides a method and apparatus for using frequency domain data, such as S-parameters, in a time-based simulator. S-parameters are either input to the simulator, or are empirically measured, at selected frequencies. Preferably, the selected frequencies are related to one another by a logarithmic scale, providing for determination of a system transfer function which is accurate across a very wide range of frequencies, from near zero hertz, to frequencies on the order of a hundred gigahertz. The transfer function preferably takes the form of a fitted polynomial, obtained using FDSI techniques. In addition, recursive convolution may be employed to operate in the time domain on inverse Laplace Transforms of the fitted transfer function and time-domain simulator test signals. This disclosure provides for circuit modeling and simulation which is accurate across a wide frequency range, which is stable for transfer functions of high order, and which is quickly and efficiently performed for large circuits.

24 Claims, No Drawings

METHOD AND APPARATUS FOR USING PARAMETERS TO SIMULATE AN ELECTRONIC CIRCUIT

The present disclosure relates to circuit simulation; in particular, it provides an improved system for quickly extracting and using frequency domain system data for use in time-based simulation.

BACKGROUND

As electronic circuit design has become increasing complicated, expensive and time consuming, computer-based circuit simulation has gained importance as a means of reliably testing designs of large circuits. Typically, a large circuit represents an aggregation of thousands of components, and it is difficult during the design stage of the circuit to predict how these components will influence one another during circuit operation. For example, reflected or time-delayed signals within a circuit may contribute to signal unintelligibility or instability, or may undesirably influence nearby electronic paths. This design problem is further enhanced when effects of other, external components are considered along with a sub-circuit being modeled. For example, when effects of adjacent high frequency transmission paths or surface mounts of an integrated circuit are considered together with the design of the integrated circuit, the resulting system model may be quite different than was the case for the integrated circuit alone. Moreover, as components are called upon to operate at faster and faster speeds, driven in large part by the speed of operation of newer digital systems, analysis of transient and high frequency conditions becomes increasingly critical to circuit reliability.

It is frequently desired to test large circuit designs before circuit prototypes are actually built, since prototype fabrication may be costly and time consuming; computer simulation of mathematical models only of the circuit design, before prototype fabrication, can lead to quick design changes while saving many thousands of dollars associated with such fabrication.

To this end, circuit simulation is frequently performed by software which operates on a mathematical model of a large circuit. A mathematical model of a circuit is frequently used, even if a circuit prototype is actually available, since high speed computers can quickly and efficiently predict circuit response at many different measurement points within the circuit, for example, at the ports of an integrated circuit, for many different input signal conditions. For large circuits designs, manual simulation can sometimes take far more time that computer-based simulation. Of course, the accuracy and speed of the computer-based model are very dependent upon the simulation tools used.

Many common computer simulators are variations of an early simulator tool, "SPICE," (which stands for "simulation program with integrated circuit emphasis"). These programs typically operate by accepting circuit frequency response parameters, either directly from a computer aided design ("CAD") package, a simulator (using discrete frequencies to directly measure frequency response of a circuit prototype), or another means. The simulator then is then typically used to, based upon these parameters, simulate special signal conditions for the circuit which are usually not discrete frequencies, i.e., to predict transient responses and the like. The computer-based simulators typically use numbers which represent test input signals, e.g., initial voltages, currents and frequencies. The simulators then usually conduct a time-based analysis of response to the input signal conditions at the different measurement points of the circuit.

Some simulators employing "direct convolution" operate directly on the frequency response parameters by multiplying them with input test signals which have been converted to the frequency domain (including both instantaneous inputs as well as historical inputs, to thereby account for time-delays within the circuit). By properly selecting test frequencies, one obtains information to predict an entire range of operation of a digital device (commonly extending from near zero hertz to several gigahertz). Ideally, a set of frequency responses provides a complete set of information from which to model circuit performance for any given input frequency or condition. This information is then processed to determine the frequency response parameters which, generally, are in the form of an impedance matrix or an admittance matrix; it is also sometimes desired to use a "scattering" matrix, which is defined by the relation $$S = \frac{(Q-Y)(Q+Y)^{-1}}{Z_0},$$

where "Q" is an identity matrix, "Y" is an admittance matrix for the circuit, and $Z_0$ is a reference impedance. Scattering parameters (or "S-parameters") are sometimes preferred, because the S-parameters of passive devices will always have an absolute value less than 1, dramatically increasing the stability of typical analysis based upon them. The computer-based simulator may then operate by using an Inverse Fast Fourier Transform ("IFFT") to convert the parameters to the time domain, and by applying time-intensive direct convolution of the time domain parameters to the test input signals of interest, to yield predicted circuit behavior. Unfortunately, use of the IFFT requires that the frequency response parameters represent evenly spaced frequencies, e.g., 0, 5, 10, 15 kilohertz, etcetera.

While generally acceptable for many circuits, direct convolution processes can sometimes take many hours to run for complicated circuits, because of the number of iterations that need to be performed. For example, since direct convolution methods typically convert time history of the test input signals, at each time increment, to the frequency domain for multiplication with frequency response parameters, which requires a great deal of numerical processing for each time step. Furthermore, the requirement that the parameters represent only evenly spaced test frequencies implies that frequency response of the circuit must be measured for an inordinate number of test frequencies, since it is typically desired to ascertain frequency response for frequency change of only a few hertz, yet also cover the circuit's entire operating range. Consequently, use of direct convolution and an IFFT can be quite time consuming where testing is desired over a very large frequency range. There is a definite need for a circuit simulator which can accommodate testing over a very wide frequency range, preferably using parameters not measured at evenly spaced frequencies, and that can perform processing very quickly, even for large circuits.

Other common simulator designs use alternatives to direct convolution known as "macromodeling" or "recursive convolution." "Macromodeling" is performed using the impedance, admittance or S-parameters to build and fit a system transfer function that describes response at each measurement point in dependence upon inputs signals to the circuit; in other words, a formula is computed from the frequency response parameters, and the parameters are not directly used themselves in the actual simulation. The transfer function typically is estimated by computing a rational polynomial, based on the frequency response parameters, and applying an iterative best fit analysis. The resulting polynomials are then implemented as equivalent circuits, and the circuit under consideration is processed by time-stepped analysis using a simulator, for example, using a "SPICE" simulator. Alternatively, simulators employing "recursive convolution" typically take an inverse Laplace transform of the fitted polynomials, to obtain time-domain relations, and use processing shortcuts to convolve the time-domain relations with inputs to the circuit.

Macromodeling and recursive convolution techniques have their advantages, as does direct convolution. For example, macromodeling and recursive convolution typically do not employ an IFFT process and, thus, those techniques may be used with parameters which are not based on regularly spaced frequencies. Furthermore, because macromodeling and direct convolution techniques do not directly use multiplication between time history and individual system parameters, the resulting simulation can sometimes be performed much more quickly than direct convolution. Unfortunately, macromodeling and recursive convolution typically are based on fit Padé Approximation or Least-Squares Fitting algorithms, which may result in the presence of unstable poles when the order of the rational polynomial of the system transfer function exceeds six or seven. Direct convolution does not have this limitation, but as mentioned, direct convolution methods can be quite consuming, and requires an use of evenly spaced test frequencies. These processes therefore typically present problems which may influence reliability or speed of simulation.

There is a definite need for a system that can quickly simulate complicated circuit designs, particularly for circuits which are modeled by a transfer function of high order. Furthermore, there is a need for a system that can accept parameters which are not based on evenly spaced test frequencies, but rather, which can be related to each other by a logarithmic or other non-linear scale; such a system could process information representing a much greater frequency range using fewer computational resources. Ideally, such a system should be in form where it can be integrated with relatively minor deviation from typical simulator programs, such as "SPICE," such that the system can directly operate on standard simulator inputs. The present invention solves these needs and provides further, related advantages.

SUMMARY OF THE INVENTION

The present invention provides for time-based simulation of a circuit design using frequency domain data. More particularly, the present invention utilizes Frequency Domain System Identification ("FDSI") techniques to fit a transfer function to system parameters, thereby fitting a transfer function which is stable for polynomials of extremely high order. Substantial time and complexity savings for many circuits is achieved by not relying upon a Fast Fourier Transform ("FFT") computation, enabling parameter extraction at frequencies which can be selected according to a logarithmic scale. This configuration also provides for relatively accurate simulation, since a system transfer function may be quickly estimated with a high degree of confidence, across a range of from near zero hertz to a hundred or more gigahertz. In its more detailed aspects, the invention also provides substantial time savings if direct convolution is utilized to perform simulation, as opposed to macromodeling, using computational shortcuts. It should therefore readily be appreciated that the present invention provides for faster and more accurate simulation.

More particularly, the invention provides a method of using parameters to simulate an electronic circuit having a plurality of measurement points. The parameters are preferably impedance, admittance or S-parameters, or equivalents which represent circuit behavior in response to input signals. In particular, the method includes selecting a plurality of test frequencies with which to measure frequency response of the electronic circuit at each of the measurement points. The circuit is measured, or a mathematical model of circuit design is used, to calculate the frequency response parameters in dependence upon each of the test frequencies. Once the parameters have been obtained, the parameters are analyzed and a transfer function is fit to the parameters using Frequency Domain System Identification ("FDSI"). Finally, once the fitting of the transfer functions is complete for each measurement point, the circuit is simulated using the fitted transfer functions in response to input signal conditions of interest.

In more detailed aspects of this form of the invention, the fitting of the transfer function can be accomplished by fitting a rational polynomial to S-parameters, using FDSI. Simulation based on recursive convolution or macromodeling may then be performed. Still further, if recursive convolution is performed, a substantial amount of integration can be eliminated using multiplication with an exponential. Ideally, extraction of parameters is accomplished using frequencies which are related by a logarithmic scale, which are averaged over several measurements to obtain parameters which are unaffected by statistical bias.

A second form of the invention provides an apparatus consisting of code stored on a machine readable media. The code directs a machine to process circuit parameters in much the same manner as has just been described.

The invention may be better understood by referring to the following detailed description, which should be read in conjunction with the accompanying drawings. The detailed description of a particular preferred embodiment, set out below to enable one to build and use one particular implementation of the invention, is not intended to limit the enumerated claims, but to serve as a particular example thereof.

DETAILED DESCRIPTION

The invention summarized above and defined by the enumerated claims may be better understood by referring to the following detailed description, which should be read in conjunction with the accompanying drawings. This detailed description of several particular preferred embodiments, set out below to enable one to build and use certain implementations of the invention, is not intended to limit the enumerated claims, but to provide particular examples thereof. The particular example set out below is the preferred implementation of a system that identifies parameters for simulation using frequency domain data, and which then applies fast recursive convolution techniques to perform simulation. The invention, however, may be applied to other types of systems as well.

I. Introduction to the Principal Parts.

The preferred embodiment is a system for extracting parameters representing frequency domain (data and applying those parameters to perform relatively fast simulation. The capability of time domain simulation utilizing frequency domain data exists in some time-domain simulators, but the computations can be very time-consuming. The preferred embodiment decreases this computational burden by utilizing Frequency Domain System Identification ("FDSI") techniques to fit a transfer function to S-parameters, and also by utilizing a special process for performing fast recursive convolution. Since the preferred embodiment uses recursive convolution, instead of an Inverse Fast Fourier Transform ("IFFT"), the frequencies at which the S-parameters are sampled may be spaced in any way. For example, a logarithmic frequency spacing allows S-parameters to be sampled over a broader band without increasing the number of frequencies measured. Ideally, the principles taught herein may be applied to conventional simulator designs based on "SPICE," such that the preferred embodiment consists of code (firmware or software) which controls a machine (a computer's CPU) to obtain the frequency domain data perform simulation based on that data.

The preferred embodiment is designed to perform the following tasks, as will be elaborated upon below. First, frequencies at which circuit response will be sampled must be selected; these frequencies will be referred to herein as "test frequencies," and are chosen such that a transfer function can be estimated in a manner that it is accurate for all regions of interest, e.g., all applicable forms of transient response. Second, frequency response parameters are determined for the system. These parameters are determined by measuring frequency response of the system based on each discrete test frequency; this determination can be made by measuring points of interest ("measurement points" the circuit of interest) with an appropriate instrument, or through computer aided design ("CAD") simulation, which uses computer processing of a computer-stored design. From the measured frequency response, parameters are extracted which may be in the form of admittance parameters, impedance parameters, or scattering parameters, and which describe the behavior of the circuit at the test frequencies. Preferably, scattering parameters ("S-parameters") are used for this purpose. Third, a transfer function is fitted to the calculated frequency response parameters. The transfer function is an equation which describes, for a given input signal, how the system responds. In the case of circuits which are modeled as lumped elements, the transfer function is expected to be a rational polynomial; in a situation in which the S-parameters behave as distributed elements (e.g., the S-parameters vary sinusoidally with frequency), the transfer function will be fitted as a sum of complex exponentials. Fourth, the transfer function is fed into a "SPICE" simulator which computes an Inverse Laplace Transform ("ILT") of the transfer function, and recursively convolves the ILT with time-stepped signals of interest (i.e., a signal for which it is desired to measure transient response of the circuit). As an example of a circuit which may be simulated using the preferred embodiment, it may be assumed that the circuit of interest is an integrated circuit design which will ultimately be a sub-component of a larger circuit. Recursive convolution has been implemented using a version of "HP-SPICE" (Hewlett-Packard Company's SPICE program) which has been modified to add recursive convolution and FDSI to its capabilities.

Importantly, in many applications, correct transient analysis requires that the resulting system transfer function be accurate for frequencies, extending between DC (zero hertz) to well over one gigahertz. Accuracy of the transfer functions, in turn, requires that frequency response of the circuit under study be sampled for a sufficient number of discrete frequencies, such that complete response of the system can be estimated. The large number of data samples present in such measurements, along with the fact that convolution operations on these samples must be performed at each simulator time step, imply that the resulting simulation runs may be time consuming. For example, if one is modeling a high-bandwidth device such as a high-speed digital interconnection, digital signals can be quiescent for long periods of time. In order to simulate such a device accurately, the frequency response parameters must represent closely spaced frequencies near DC. At the same time, high frequencies must be sampled in order to capture the behavior of the device when a fast signal edge is applied. Direct convolution using IFFTs may be prohibitive for such analysis, because the close frequency spacing near DC must be continued through the high frequencies based on the requirement that IFFT operate on evenly spaced frequencies on a linear scale, and utilizing many frequencies increases the simulation time.

To avoid the requirement of using regularly spaced test frequencies with which to extract parameters, the preferred embodiment utilizes recursive convolution. Recursive convolution differs from traditional direct convolution methods in that recursive convolution typically operates on closed-form equations that describe frequency response parameters rather than upon the parameters themselves. This operation facilitates convolution using a small number of floating point operations which does not increase substantially as the number of test frequencies and measured parameters increases. With recursive convolution, the test frequencies at which the frequency response parameters are sampled may be spaced in any way. For example, a logarithmic test frequency spacing allows detailed sampling over a relatively broad frequency band without substantially increasing the number of test frequencies used and resultant parameters.

II. Selection of Test Frequencies.

The test frequencies $\{\omega_f | f=1, 2 \ldots F\}$ at which S-parameters will be extracted must be first chosen by the user. It is not required that these frequencies be on a regular grid, because unlike direct convolution, resultant parameters will not be subject to an IFFT process. The test frequencies are preferably selected, however, to cover an enormous band. Frequencies near DC generally must be represented, because the long term behavior of a circuit typically depends on its low frequency behavior. As an example, if insufficient frequencies near DC are sampled, the transfer function fit for frequencies near DC will be poor. It can be expected that any resultant simulation would provide correct predictions of circuit behavior immediately subsequent to input signal transition, but that the predictions would likely be incorrect by a DC offset once the input signal is quiescent. Therefore, if the instrumentation available (either the CAD package from which the circuit design is obtained, or a simulator with which to measure an actual circuit prototype) permits, the lowest frequency is ideally chosen to be on the order of one hertz.

Generally, however, high frequencies must also be selected, such that the resultant transfer function accurately represents transient conditions. The highest frequency for which frequency response parameters will be sampled must be chosen in view of the circuit being modeled; a circuit that experiences signal cutoff above a certain frequency should have its frequency response parameters sampled well into its cutoff region. Parameter sampling at sufficiently high frequencies will ensure that the fitted transfer function accurately models circuit performance above the highest chosen frequency. If the highest frequency selected is too low a frequency, the fitted transfer function could model the circuit under study as passing high frequencies, resulting in a failure to predict non-physical ringing or undetected divergence from a desired output, which ought to be during the design stage.

In the preferred embodiment, the highest frequency is generally chosen to be on the order of two or three decades past the cutoff frequency of the highest passband of the circuit being modeled. There are some devices, such as high-frequency transmission lines, that do not experience cutoff at any reasonable frequency, and the frequency response parameters for such devices may vary sinusoidally with frequency. In such an instance, care must be taken to measure frequency response for a minimum of a half of an "oscillation." The chosen frequencies must also be close enough together so that all of the behavior of the circuit is accurately modeled. To his effect, it is generally expected that selection of the frequencies should include at least eight or sixteen frequencies per decade of frequency. However, if the circuit being modeled contains inductive elements with closely-spaced resonances, more frequencies should be chosen, near the frequencies at which such resonances occur.

III. Extraction of Frequency Response Parameters.

The selected test frequencies are used to discretely obtain samples of performance of the circuit under study across a range of frequencies. Generally, measurements will be made at the ports of the device under study (e.g., an integrated circuit). From these responses, given the signal used to produce the response, frequency response parameters are calculated which describe circuit response to the test signals at the test frequency used. Typically, these parameters will be related to admittance or impedance in some manner.

For example, voltage at any port is given by the relation $$V = I \cdot Z,$$

where "I" is a row matrix of currents leading to and away from the measurement point under consideration, and "Z" is an impedance matrix that accounts for resistive, capacitive and inductive effects, which will vary with frequency. Alternatively, voltages and currents may be related by the equation $$I = Y \cdot V,$$

where "Y" is a corresponding admittance matrix.

In the preferred embodiment, admittance and impedance parameters are not used, but instead, scattering parameters (or "S-parameters") are used in their place. S-parameters are related to admittance parameters by the relation $$S = \frac{(Q-Y)(Q+Y)^{-1}}{Z_0},$$

where "Q" is the identity matrix (normally, the designation "I" would be employed, but this designation has already been used to refer to current). S-parameters are preferably used instead of impedances or admittances because the S-parameters of passive devices will always have an absolute value less than one. This characteristic dramatically increases the numerical stability of all of the processing described below, and it facilitates modeling of both short circuits and open circuits as finite values without a need for special-case code. Thus, a matrix of S-parameters will be computed for each test frequency.

All of the above-mentioned parameters (scattering, impedance and admittance) are equivalent, in the sense that there are well understood formulas for converting between them, as well as converting to other parameters that describe circuit performance as a function of input. Irrespective of the choice of the particular form of the frequency response parameter, it is desired to sample circuit behavior at the selected frequencies in order that an equation, a well-fitted transfer function, may be obtained, which accurately predicts circuit response at all frequencies. The equation is computed once, such that when fitted, the transfer function ideally is very accurate for use in predicting response to any type of input signal, not just the discrete test frequencies.

The frequency response of the circuit of interest (and the S-parameters calculated therefrom) is obtained in one of several ways. The simplest way of extracting S-parameters is to utilize a physical measurement tool, typically a network analyzer (such as the "HP8510" or "HP4396" series network analyzers, made by Hewlett-Packard Company), which measures circuit response and automatically calculates S-parameters, providing them as a digital output. If, however, a prototype of the circuit to be simulated is not available to be physically measured, but an equivalent circuit is, an AC analysis with SPICE can be used to obtain the S-parameters. For example, Hewlett-Packard's Microwave Design System ("MDS") or High Frequency Structure Simulator ("HFSS") employ SPICE algorithms, and can be used to directly compute S-parameters from models of the physical structure of the devices of interest. Lastly, if computer-stored design details of the circuit of interest are available, for example, certain computer aided design ("CAD") formats, S-parameters can sometimes be computed directly from these design details using appropriate CAD tools.

In situations where a circuit prototype or equivalent circuits are to be measured, measurement noise can bias the transfer function obtained from the frequency response parameters. To avoid this potential source of error, it is preferred that multiple measurements must be performed for the frequency response parameters, such that each parameter representing a given test frequency is actually the product of several measurements. In this way, presuming normal distribution of noise, the average measurements are relatively unbiased by noise. In addition, the standard deviation of the measurements as a function of frequency can be computed and is utilized determining the fitting a transfer function, as will be described below.

IV. Fitting of a Suitable Transfer Function.

Once frequency response parameters have been measured to thereby yield a set of matrices which are indexed by test frequency, a transfer function is then fitted to the parameter data to define a frequency dependent relation that is accurate for all frequencies. Ideally, the S-parameters are first analyzed to determine whether they vary sinusoidally with frequency. If the S-parameters do vary sinusoidally with frequency, then the transfer function is modeled as a sum of complex exponentials, as will be described below. Otherwise, FDSI models the transfer function as a rational polynomial, by analyzing the S-parameter matrices to find coefficients that satisfy the relation $$(\Sigma_k a_k s^k) \cdot S_{r,c}(s) = (\Sigma_k b_k s^k),$$

where small "s" represents the frequency notation used for Laplace transformations, "$S_{r,c}$" represents the S-parameter at row "r," column "c" of an S-parameter matrix for a particular test frequency, and "k" represents the order of the polynomial. Initially, the order "k" of the polynomial is determined based upon analysis of S-parameter variation using known methods, for example, by taking derivatives of S-parameters with respect to frequency. Subsequent to determining the order "k" of the polynomial, FDSI is used to obtain statistically asymptotically unbiased estimates of "$a_k$"

and "$b_k$." FDSI in effect assumes that the S-parameter data $S_{c,r}(j\omega)$ was measured with noise at both ports "c" and "r," and has gaussian distribution of known standard deviations, $\sigma_r(\omega)$ and $\sigma_c(\omega)$. The FDSI fit depends on the relative values of the various standard deviations, and if the S-parameters represent the mean of multiple measurements, then the standard deviations can be estimated to be the standard sample standard deviations. Where the S-parameter data are computed rather than measured, the standard deviations $\sigma_r(\omega)$ and $\sigma_c(\omega)$ are presumed to be equal to one. FDSI operates to find "$a_k$" and "$b_k$" and complex numbers "$u_f$" and "$v_f$" such that $$\frac{u_f}{v_f} = \frac{(\sum_k b_k(j\omega)^k)}{(\sum_k a_k(j\omega)^k)},$$

for all sampled frequencies $\omega_f$, while simultaneously minimizing the weighted least-squares error function $$\Sigma_f(\sigma^2_r(\omega_f)|u_f - S_{r,c}(\omega_f)|^2) + \Sigma_f(\sigma^2_c(\omega_f)|u_f - 1|^2).$$

In other words, FDSI effectively chooses the quantities "$a_k$" and "$b_k$" such that the equation for "$u_f/v_f$" is satisfied exactly for minimally perturbed data.

Those desiring additional detail on FDSI are referred to the following articles, which are hereby incorporated by reference, as though fully set forth herein: (1) "Fast Time Domain Simulation in SPICE with Frequency Domain Data," distributed at the 47th Annual Electronic Components and Technology Conference, San Jose, May 20, 1997; (2) Schoukens, J. And R. Pintelon, *Identification of Linear Systems: A Practical Guide to Accurate Modeling*, Pergamon, 1991; and (3) Kollar, I., *Frequency Domain System Identification Toolbox*, Mathworks, Inc., 1994.

S-parameters that vary sinusoidally by frequency can often be approximated well as the sum of complex exponentials $$\Sigma_i A_i e^{(j\alpha_i \omega)},$$

where "$\omega$" is frequency in hertz. The real coefficients "$\alpha_i$" and "$A_i$" are determined so as to minimize the squared-error between the sum of exponentials and the measured S-parameters. The expression "$\alpha_i$" is constrained to be negative, and the inverse Fourier transform $$\Sigma_i A_i \delta(t-\alpha_i)$$

is easily implemented in recursive convolution analysis, described below.

V. Simulation.

Once a suitable transfer function has been fitted to the measured S-parameters, then the fitted transfer function is utilized to perform simulation, either via its implementation as an equivalent circuit and macromodeling using a simulator such as "SPICE," or via use of recursive convolution alone. Preferably, recursive convolution is utilized to at least model a sub-circuit, with macromodeling being utilized thereafter as appropriate, based upon the transient response of a sub-circuit which has been simulated in the time-domain.

To simulate distributed circuit elements, convolution operations of the form $$y_{n+1} = \int_{-\infty}^{t_{n+1}} [x(t) \cdot h(t_{n-1} - \tau)]$$

typically must be performed at each transient time-step. The quantity "x(t)" in the relation above represents a time-domain reflected voltage wave. At time step "t(n+1)," its values at the previous time instants (i.e., $x(t_0)$, $x(t_1)$, ..., $x(t_n)$) are all known, and $x(t_n+1)$ is to be determined. The integration set forth in the equation above must be carried out K times for every distributed K-port at each transient time point. Consequently, circuits containing numerous distributed elements with even moderately long impulse responses often promise prohibitive use of computational resources the convolution operations discussed above are utilized.

However, the preferred embodiment utilizes a simplified approach which achieves substantial time savings using multiplication by an exponential to eliminate a large range of integration. For elements which can be characterized via rational polynomial S-parameters, computational shortcuts are taken which provide for recursive convolution. By taking an Inverse Laplace Transform of the transfer function "h(n)," one obtains a time-domain relation described by $$h(t) = \sum_{i=1}^{N} \sum_{m=0}^{M_i} \left( B_{im} \frac{t^m}{m!} e^{p_i t} \right).$$

Inserting this expression into the convolution operation set forth above yields the equation $$y(n+1) = \sum_{i=1}^{N} \sum_{m=0}^{M_i} \left( \beta_{im} \frac{t^m}{m!} \sum_{k=0}^{m} \binom{m}{k} t_{n+1}^{m-k} \varphi_{nki} \right),$$

where in turn $$\varphi_{nki} = \int_{-\infty}^{t_{n+1}} (-\tau)^k e^{p_i(t_{n+1}-\tau)} x(\tau) \delta\tau.$$

The key to evaluating the expression "$Y_{n+1}$" in a fast and accurate manner is by never attempting to carry out the full integration described by the equation just above, because "$\phi_{nki}$" can be computed through the recursive formula $$\varphi_{nki} = \varphi_{(n-1)ki} e^{p_i(t_{n+1}-\tau)} + \int_{t_n}^{t_{n+1}} (-\tau)^k e^{p_i(t_{n+1}-\tau)} x(\tau) \delta\tau.$$

By taking the expression "$x(\tau) = a_n + b_n \tau$," over the interval from "$t_n$" to "$t_{n+1}$," the relation $$X_{nki} = \int_{t_n}^{t_{n+1}} (-\tau)^k e^{p_i(t_{n+1}-\tau)} x(\tau) \delta\tau.$$

is obtained. Further, by computing the quantities "$I_{nki}$," for $0 \leq k \leq M_i + 1$, the relations $$I_{n0i} = \frac{1}{p_i}(e^{(p_i(t_{n+1}-t_n))} - 1), \text{ for } k = 0$$

and $$I_{nki} = \frac{1}{p_i}(-(t_{n+1}^k) + (t_n^k)(e^{(p_i(t_{n+1}-t_n))}) + k \cdot I_{n,k-1,i}), \text{ for } k \geq 1,$$

are also obtained. Once these calculations are complete, the quantity "$X_{nki}$" is computed using the relation $$X_{nki} = (-1)^k (a_n I_{nki} + b_n I_{n(k+1)i})$$

Factoring these relations into the recursive formula stated above, one may implement the recursive relation $$\phi_{nki} = \phi_{(n-1)ki} e^{p_i(t_{n+1}-\tau)} + X_{nki}$$

which provides substantial time savings over the full integration and convolution operations described at the beginning of this section.

Use of recursive convolution and FDSI present many advantages. Like Pade and Least-Squares fitting, the simulation time is independent of the quantity of S-parameters obtained, since simulation is performed using a fitted transfer function. The fitted transfer function will be accurate for low frequencies near DC, such that simulation should accurately predict quiescent response, midrange response and very high frequency response. An advantage of using S-parameters measured from arbitrary frequency points is that one can perform adapted measurement, e.g., one can obtain further S-parameters based on closed-loop interaction between simulation trials and parameter sampling, and can automate this process by including code to perform these tasks as a part of the simulator code.

Use of recursive convolution and FDSI presents several additional advantages however over Pade and Least-Squares fitting; first, a very high order stable rational polynomial can be fitted to the S-parameter data, for example, polynomials having an order on the magnitude of thirty-five or greater. This ability tends to provide a more accurate fitted transfer function and, therefore, more accurate simulation. Furthermore, FDSI techniques provides statistically unbiased estimates of S-parameters, thereby leading to a more correct transfer function estimate, irrespective of the order of the fitted transfer function.

VI. Replacement of a Sub-circuit With A SPICE Node Using FDSI and Recursive Convolution, And Performance of Macromodeling.

The computation burden of traditional "SPICE" simulation can also be reduced for a large group of passive elements, by replacing the large group of passive elements with a single "SPICE" node that contains a closed-form description of a sub-circuit being modeled. In this implementation, code is added to a "SPICE"-based simulator which computes the sub-circuit's frequency behavior contemporaneous with traditional "SPICE" analysis.

The following general rules are applied to sub-circuits behaving as an RC network and their integration into a large environment being modeled using "SPICE." First, where two multiport sub-circuits "X" and "Y" are connected together via a single port "1" of each, the first circuit having "n" ports and the second circuit having "m" ports, the two may be taken to be a single circuit having "m+n−2" ports having the S-parameters described below.

$$S_{j,i} = S_{j,i}^{(X)} + \frac{S_{k,i}^{(X)} \cdot S_{l,l}^{(Y)} \cdot S_{j,k}^{(X)}}{1 - S_{k,k}^{(X)} S_{l,l}^{(Y)}}, \text{ for } j, i \in X,$$

$$S_{j,i} = S_{j,i}^{(Y)} + \frac{S_{l,i}^{(Y)} \cdot S_{l,l}^{(X)} \cdot S_{j,l}^{(X)}}{1 - S_{k,k}^{(X)} S_{l,l}^{(Y)}}, \text{ for } j, i \in Y,$$

and $$S_{j,i} = \frac{S_{k,i}^{(X)} \cdot S_{j,l}^{(Y)}}{1 - S_{k,k}^{(X)} S_{l,l}^{(Y)}}, \text{ for } i \in X, j \in Y.$$

If, on the other hand, a sub-circuit is modeled as having "m" ports and a self loop from one of its ports "1" to another port "k," the resulting simplification of the model with "m−2" ports has S-parameters described as follows.

$$S_{j,i} = S_{j,i}^{(X)} + S_{j,l}^{(X)} \cdot a_1 + S_{j,k}^{(X)} \cdot a_k, \text{ for } j, i = 1, 2, \ldots, m-2$$

where $$a_1 = \frac{1}{\Delta}(S_{l,i}^{(X)} \cdot S_{k,k}^{(X)} + S_{k,i}^{(X)} \cdot (1 - S_{l,k}^{(X)})),$$

$$a_k = \frac{1}{\Delta}(S_{k,i}^{(X)} \cdot S_{l,l}^{(X)} + S_{l,i}^{(X)} \cdot (1 - S_{k,l}^{(X)})),$$

and $$\Delta = (1 - S_{l,k}^{(X)}) \cdot (1 - S_{k,l}^{(X)}) - S_{l,l}^X \cdot S_{k,k}^X.$$

For an arbitrary distributed-lumped network described by linear components, these relations are used to merge all internal components and eliminate self loops which are introduced by the process. The macromodel, or the voltage transfer function of the network, is characterized by S-parameters of the multiport component which results from the reduction process, together with the S-parameters of loads.

What has been described is a method and apparatus for using frequency domain data to perform time-based simulation, a method and apparatus which may be fully retrofitted to existing "SPICE"-based programs by addition of code or additional method tasks. Having thus described an exemplary embodiment of the invention, it will be apparent that further alterations, modifications, and improvements will also occur to those skilled in the art. Further, it will be apparent that the present invention is not limited to the specific form of a using frequency domain data with FDSI techniques to assist time-based simulation described above. Such alterations, modifications, and improvements, though not expressly described or mentioned above, are nonetheless intended and implied to be within the spirit and scope of the invention. Accordingly, the foregoing discussion is intended to be illustrative only; the invention is limited and defined only by the various following claims and equivalents thereto.

We claim:

1. A method of using parameters to simulate an electronic circuit, the electronic circuit having a plurality of measurement points, said method utilizing a digital processor and comprising:

selecting a plurality of test frequencies with which to measure frequency response of the electronic circuit at each of the measurement points;

extracting the parameters from the circuit which describe frequency response at the measurement points, for each of the test frequencies;

using the digital processor to, for each measurement point, analyze the parameters and fit at least one transfer function to the parameters to describe behavior the parameters using Frequency Domain System Identification, to thereby obtain at least one fitted transfer function; and simulating the circuit using a fitted transfer functions.

2. A method according to claim 1, wherein using the digital processor to analyze parameters and fit a transfer function includes:

using the digital processor to detect whether the parameters vary sinusoidally in response to frequency; and, if the parameters vary sinusoidally in response to frequency, fitting a sum of complex exponentials to the parameters, to thereby obtain at least one fitted transfer function which is a sum of complex exponentials.

3. A method according to claim 1, wherein using the digital processor to analyze parameters and fit a transfer function includes fitting a rational polynomial to the parameters using Frequency Domain System Identification, to thereby obtain a fitted polynomial.

4. A method according to claim 3, wherein using the digital processor includes utilizing code stored on machine readable media, the code controlling the processor to analyze the parameters and fit at least one rational polynomial.

5. A method according to claim 3, wherein simulating the circuit includes adding in the effects of additional electronic elements, and simulating environmental performance of the circuit based both on a fitted polynomial and the additional electronic elements.

6. A method according to claim 3, wherein simulating the circuit includes:

obtaining inverse transformations of a fitted polynomial to obtain a time domain relation; and using the digital processor to apply a recursive convolution between the time domain relation and simulator input signals to thereby simulate the circuit.

7. A method according to claim 6, wherein applying recursive convolution includes using a digital processor and code stored on machine readable media, the code causing the processor to perform the recursive convolution.

8. A method according to claim 6, further comprising a step for performing recursive convolution by multiplication with an exponential to eliminate time costs associated with integration over a large range.

9. A method according to claim 6, wherein applying recursive convolution includes using an application specific processor chip to apply recursive convolution.

10. A method according to claim 6, wherein applying recursive convolution includes:

obtaining an inverse Laplace transform of a fitted polynomials to obtain a time domain relation.

11. A method according to claim 1, wherein said method is applied to an actual circuit and extracting parameters includes:

discretely providing, as an input to the actual circuit, each one of the plurality of test frequencies, and electronically measuring response to the inputs, multiple times for each one of the plurality of test frequencies;

for each test frequency, averaging the corresponding responses at each of the measurement points to yield averaged responses; and computing statistically averaged parameters from the averaged responses.

12. A method according to claim 1, wherein extracting parameters includes:

extracting scattering parameters corresponding to each of the measurement points, for each test frequency.

13. A method according to claim 1, wherein extracting parameters includes:

measuring response at each test frequency several times utilizing an electronic parameter extraction device which provides discrete test frequency inputs to an actual circuit, and automatically measures responses at each of the measurement points.

14. A method according to claim 1, wherein selecting test frequencies includes manually controlling a simulator to input desired frequencies into a physical circuit.

15. A method according to claim 1, wherein selecting test frequencies includes selecting test frequencies which are related to one another by substantially logarithmic scaling.

16. A method according to claim 15, wherein selecting test frequencies related to one another by substantially logarithmic scaling includes selecting at least four frequencies per decade.

17. A method according to claim 1, wherein selecting test frequencies includes selecting one of the frequencies to be no less than twice the highest expected frequency to be encountered any measurement point in circuit operation.

18. A method according to claim 17, wherein selecting no less than twice the highest expected frequency includes selecting a test frequency which is at least two decades above the cutoff frequency for the highest passband of the circuit.

19. An apparatus comprising code for controlling a machine to simulate a circuit based on parameters, and machine-readable media on which the code is stored, the parameters representing frequency-dependent response at each of a plurality of measurement points, said code directing a machine to:

fit at least one transfer function to the parameters, the transfer function representing behavior at the corresponding measurement point in response to frequency, to thereby obtain at least one fitted transfer function; and simulate the circuit using a fitted transfer function;

wherein the code directs the machine to fit a transfer function using Frequency Domain System Identification.

20. An apparatus according to claim 19, wherein the code directs the machine to detect whether the parameters vary sinusoidally with respect to frequency and, if so, to fit a sum of complex exponentials to the parameters to thereby obtain a fitted transfer function.

21. An apparatus according to claim 19, wherein the code directs the machine to fit a rational polynomial to the parameters to thereby obtain a fitted polynomial, the fitted polynomial representing behavior in response to frequency.

22. An apparatus according to claim 21, wherein the code further directs the machine to simulate the circuit by:

taking an inverse Laplace Transform of a fitted polynomial; and applying recursive convolution between the inverse Laplace Transform and time-based input signals.

23. An apparatus according to claim 22, further comprising means for performing recursive convolution by multiplication with an exponential to eliminate time costs associated with integration over a large range.

24. An apparatus according to claim 19, wherein the code directs the machine to fit a transfer function using parameters representing responses to unevenly spaced test frequencies.

* * * * *